US009390067B2

United States Patent
Garnacho Vecino et al.

(10) Patent No.: US 9,390,067 B2
(45) Date of Patent: Jul. 12, 2016

(54) METHOD FOR THE CONTINUOUS MONITORING AND DIAGNOSIS OF SOURCES OF PARTIAL DISCHARGES (PDS) IN HIGH VOLTAGE CABLES DURING CONNECTION TO, AND OPERATION IN THE POWER GRID, AND PHYSICAL SYSTEM FOR CARRYING OUT SAME

(75) Inventors: Fernando Garnacho Vecino, Madrid (ES); Miguel Angel Sanchez-Uran Gonzalez, Madrid (ES); Javier Ortego La Moneda, Madrid (ES)

(73) Assignee: UNIVERSIDAD POLITECNICA DE MADRID, Madrid (ES)

( * ) Notice: Subject to any disclaimer, the term of this patent is extended or adjusted under 35 U.S.C. 154(b) by 688 days.

(21) Appl. No.: 13/700,040

(22) PCT Filed: May 24, 2011

(86) PCT No.: PCT/ES2011/000169
§ 371 (c)(1),
(2), (4) Date: Mar. 7, 2013

(87) PCT Pub. No.: WO2011/151481
PCT Pub. Date: Dec. 8, 2011

(65) Prior Publication Data
US 2013/0211750 A1   Aug. 15, 2013

(30) Foreign Application Priority Data
May 26, 2010 (ES) .................................. 201000685

(51) Int. Cl.
*G06F 17/14* (2006.01)
*G01R 31/08* (2006.01)
(Continued)

(52) U.S. Cl.
CPC ............ *G06F 17/148* (2013.01); *G01R 31/021* (2013.01); *G01R 31/088* (2013.01); *G01R 31/1272* (2013.01); *G06F 17/18* (2013.01); *G01R 31/083* (2013.01)

(58) Field of Classification Search
CPC ............. G01R 31/1272; G01R 31/088; G01R 31/021; G01R 31/083; G06F 17/18; G06F 17/148

USPC .......... 702/58, 59, 72, 76; 324/126, 536, 500, 324/512, 521
See application file for complete search history.

(56) References Cited

U.S. PATENT DOCUMENTS 3,845,322 A * 10/1974 Aslin ..................... H03K 3/537
                                                     307/108
4,710,705 A * 12/1987 Kawabata .......... G01R 31/1254
                                                     324/102

(Continued)

FOREIGN PATENT DOCUMENTS

| EP | 2 187 226 | 5/2010 |
| WO | WO 2006/092632 | 9/2006 |
| WO | WO 2010/015958 | 2/2010 |

OTHER PUBLICATIONS

International Search Report from International Application No. PCT/ES2011/000169 mailed Nov. 21, 2011.

(Continued)

*Primary Examiner* — Carol S Tsai
(74) *Attorney, Agent, or Firm* — Merchant & Gould P.C.

(57) ABSTRACT

A method specially designed for detecting events associated with partial discharges (PDs) in high voltage cables includes the identification of the location and the evaluation of the amplitude and rate of repetition per period of the grid voltage, with the possibility of identifying different sources producing PD signals as a function of the location thereof and recognising the type of defect associated with PDs in the same location. Generated electric signals are measured and the discriminated in relation to the background noise. A system for carrying out the method includes devices for discriminating the noise in relation to the transient waveform of the PD, determining the parameters associated therewith, determining the map of sources of PDs along the length of the cable, graphically representing the sources, and identifying the patterns of the sources of PDs separated as a function of the location thereof along the length of the cable.

12 Claims, 5 Drawing Sheets

(51) Int. Cl.
*G06F 17/18* (2006.01)
*G01R 31/02* (2006.01)
*G01R 31/12* (2006.01)

(56) References Cited

U.S. PATENT DOCUMENTS

| | | | | |
|---|---|---|---|---|
| 6,178,386 | B1 * | 1/2001 | Shertukde | G01N 29/14 336/145 |
| 6,774,639 | B1 * | 8/2004 | Unsworth | G01R 31/1227 324/535 |
| 6,809,523 | B1 | 10/2004 | Ahmed et al. | |
| 8,027,096 | B2 * | 9/2011 | Feng | G02B 3/14 235/454 |
| 8,126,664 | B2 * | 2/2012 | Fournier | G01R 31/1272 324/500 |
| 8,687,282 | B2 * | 4/2014 | Feng | G02B 3/14 359/665 |
| 8,760,171 | B2 * | 6/2014 | Steineke | G01R 31/1272 324/536 |
| 2004/0260169 | A1 * | 12/2004 | Sternnickel | A61B 5/04007 600/409 |
| 2007/0063048 | A1 * | 3/2007 | Havens | G06K 7/10702 235/462.46 |
| 2008/0144186 | A1 * | 6/2008 | Feng | G02B 3/14 359/666 |
| 2009/0012727 | A1 * | 1/2009 | Siew | G01R 31/088 702/59 |
| 2009/0177420 | A1 * | 7/2009 | Fournier | G01R 31/1272 702/59 |
| 2011/0291666 | A1 * | 12/2011 | Steineke | G01R 31/1272 324/551 |

OTHER PUBLICATIONS

Stone et al., "Partial Discharge Diagnostics and Electrical Equipment Insulation Condition Assessment", *IEEE Transactions on Dielectrics and Electrical Insulation,* vol. 12, No. 5, 2005, pp. 891-903.

* cited by examiner

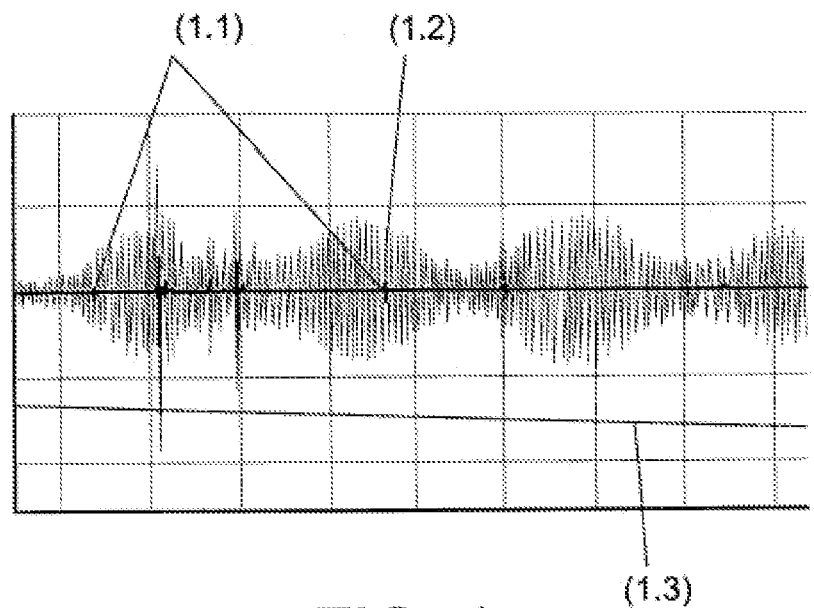
FIG. 1
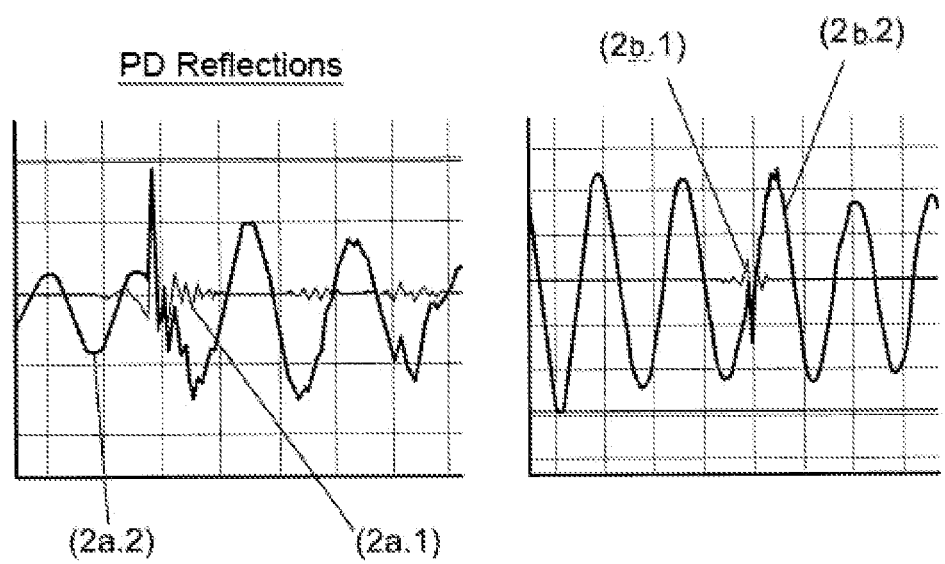
FIG. 2a
FIG. 2b

METHOD FOR THE CONTINUOUS MONITORING AND DIAGNOSIS OF SOURCES OF PARTIAL DISCHARGES (PDS) IN HIGH VOLTAGE CABLES DURING CONNECTION TO, AND OPERATION IN THE POWER GRID, AND PHYSICAL SYSTEM FOR CARRYING OUT SAME

This application is a National Stage Application of PCT/ES2011/000169, filed 24 May 2011, which claims benefit of Serial No. P201000685, filed 26 May 2010 in Spain and which applications are incorporated herein by reference. To the extent appropriate, a claim of priority is made to each of the above disclosed applications.

OBJECT OF THE INVENTION

The present invention relates to a new method for monitoring partial discharges (PDs) in high voltage (HV) cables, with junctions and terminations installed when they are operating within an alternating high voltage power grid. The method consists of discriminating, locating, measuring, identifying and diagnosing PDs for the purpose of continuously evaluating their insulation condition when they are in service. The invention also includes a physical system for carrying out the method.

The new method proposed by the present invention discriminates the PD signals in relation to electric noise, locates the position of the PDs, determines the magnitude of the PDs, identifies their behaviour as a function of the grid voltage and diagnoses the severity of the different sources of PDs for the purpose of preventing defects in the cables of medium- and high voltage electrical systems. The physical system for carrying out the method includes detection sensors for detecting the signals to measure, PD signal recording devices, signal transmission systems, information storage devices, numerical analysis tools for analysing the results implemented by the method and the necessary protection elements.

BACKGROUND AND SUMMARY OF THE INVENTION

The insulation diagnosis based on detecting and interpreting partial discharges is one of the most promising methods for evaluating the insulation condition of high voltage electrical material, such as power transformers, instrument transformers, reactors, switchgear, and particularly of the cables with the accessories thereof installed in power grids.

A "partial discharge" herein refers to an electric discharge affecting a limited part of the insulation where it is produced, without causing its immediate failure but rather its progressive degradation, except in the in case of insulation formed by the ambient air, because degradation due to ionisation is compensated with natural renewal.

However, many of the instruments available on the market include methods with serious limitations when taking on-site measurements in environments characteristic of high voltage installations with a high level of electric noise.

There are three important practical difficulties in the on-site measurements of partial discharges of HV cables which the present invention seeks to solve:

On one hand, the difficulty in distinguishing electric PD signals due to defects of the high voltage insulation of the electric signals characteristic of the electric noise of the environment (radio broadcasters, mobile telephony, white noise, etc.) masking the PD signals;

on the other hand, the difficulty in locating the position of the sources of PDs along the length of the cable in order to make the relevant repair of the faulty area, and finally, the difficulty in identifying the eventual defects involved in a specific position of the cable (for example in a cable termination) to enable assessing the severity of the defect and acting accordingly. By way of example, it is known that PDs due to the corona effect in the ambient air are not crucial for the insulation failure, whereas PDs due to an internal defect of the cable will inevitably cause the perforation of the insulation sooner or later. It is therefore necessary to know the severity of the sources of PDs.

Current techniques applied to field PD measurements try to solve some of these problems in a different manner but with serious limitations, as is explained below:

a) Problems with Electric Background Noise:

Most of the known methods try to remove the electric background noise by assuming that it is located in a frequency band in which filtering is performed. It must be pointed out that the very conception of this filtering technique causes the removal or attenuation of the noise along with the attenuation or removal also of the partial discharge signal to be measured for the filtered frequency range.

The frequency spectrum of the noise signal is analysed in other known methods in order to choose a measurement frequency band where the amplitude of the noise is the lowest possible amplitude. The drawback of this method is that sometimes the lowest noise signal band coincides with the band where the PD signal is also weak in amplitude, so the measurement of the PD is poor and inefficient. For example, if the frequency chosen for the measurement is high, then the distance attenuation can be excessive and sensitivity to the partial discharges occurring in positions away from the sensor insufficient.

Finally, another known method tries to remove noise by means of classifying the recorded signals (PDs+noise) into clusters. The clusters are formed by means of determining parameters associated with the signal shape (duration and frequency) and its amplitude. The specific drawback of this method is that the processing is performed by signal level, such that to assure the capture of PD signals the acquisition level must be reduced, and therefore the noise signal content considerably increases. Processing becomes very laborious because the noise is put together with the PDs.

All these indicated methods further have serious limitations concerning white noise, the spectrum of which covers all the frequencies of the PD signal. Frequency filtering techniques cannot be applied because the PD signal would also be lost, and a noiseless frequency band cannot be chosen either because there is a noise signal in all of them and PD clusters having a frequency different from that of the noise cannot be distinguished either.

To remedy the preceding the problems, the present invention proposes performing Wavelet transform of the recorded signal and statistically analysing its components in order to find transient events characteristic of PD pulses which are distinguished from the statistical evolution of the electric noise. The pulses recognised as transient PDs different from the noise can come from insulation failures originated in the cable or in other high voltage equipment or can also come from the power electronics connected to the grid because the power electronics causes transient events similar to the PD pulses characteristic of insulation failures. The identification tool for identifying the type of PD pulses through their patterns as a function of the phase difference with the voltage allows efficiently classifying the clusters of pulses, distinguishing those due to insulation failures from those due to the power electronics.

b) Problem with Locating the Position of the Pulse:

Most of the known methods deal with locating the PD pulses by means of the reflectometry technique which consists of acquiring signals in a measurement station located at one of the ends of the cable and determining the time delay between the signal coming directly from the source of PDs and the signal coming from the reflection at the opposite end of the cable where the circuit is left open. The position of the sources of PDs along the length of the cable is determined by taking into account the propagation speed of the PD signal through the cable. The efficacy of this method is limited for the following reasons:

The reflected signal must travel to the final end of the open cable and return along the entire length of the cable. Accordingly, for long cables having a length exceeding a kilometer, the reflected signal can arrive so attenuated that many PD pulses could not be detected and accordingly their position could not be identified. This problem is accentuated in the diagnosis of dry cables in which small PD amplitudes characterise a high risk of insulation failure, attenuation of the signal being critical for its detection;

The final end of the cable must be open in order to achieve maximum reflection of the signal, which complicates being able to apply this technique when the cable is in service, i.e., connected to the grid.

Other techniques consider that occurring PDs can only come from accessories (terminations or junctions), so sensors are arranged in each and every one of the accessories in order to attribute the location of the sources of PDs to the accessory where the amplitude of the PD signals is higher. The drawback of this method is based on the simplification of assuming that only accessories are susceptible to insulation failures, overlooking the fact that the cable itself is exposed to manufacturing defects or to assembly or operating damages. This method further requires arranging a sensor in each accessory, which is not always possible, especially in medium voltage grids in which the associated cost of the sensors and the instrumentation in each accessory does not justify applying this diagnostic technique.

Another technique consists of arranging at least two sensors along the length of a cable in different locations. When the PD signal in one of the sensors exceeds a specific level greater than the background noise, the signals coming from at least two different sensors are captured in a synchronised manner. By comparing arrival times of the same signal to the different sensors, the position of the source of PDs is determined. The drawback of this technique consists of the PD pulses having to be greater than the background noise level, which makes it difficult to find PD pulses under the background noise.

In the proposal of the present invention to solve this problem, the reflectometry technique is not used, nor is the PD signal reaching one of the sensors expected to exceed a specific level (background noise) to perform a capture of all the sensors. In the new method of the invention at least two sensors in different locations along the length of the cable are used and periodic captures synchronised per complete periods of the grid voltage wave (for example, a period of the grid voltage wave, 20 ms for 50 Hz and 16.6 ms for 60 Hz, is captured each minute) regardless of the existing background noise are performed. After each capture, the electric background noise is removed. The arrival time delay of the same PD signal to two sensors in different locations allows identifying the position of the source producing the partial discharges. This methodology can only be effectively applied as a result of the effective removal, and in a first instance, of the background noise signals, which allows clearly observing the captured PDs, locating the position of the sources of PDs in extremely severe electric noise environments.

c) Problem with Identifying the Type of Defect Associated with PDs:

The identification of the type of source associated with the measured PDs is not resolved in most diagnostic techniques for diagnosing cable insulation condition, leaving this decision to the operator's judgment. Some techniques use the phase difference of the PDs in relation to the voltage applied for generating a pattern of the sources of PDs in order to help the operator make a decision.

Characteristic patterns of PDs in phase with the voltage, which are referred to as reference patterns of PDs, are known to be produced as a function of the type of defect (cavity inside the insulation, surface discharge in dirty or faulty insulations, corona effect in air in sharp-pointed conductive parts, etc.). If the measured pattern of the PDs in the entire cable is compared with the reference patterns, it is possible to observe whether there is a single defect or several defects. However, when there are several defects along the length of the cable, their corresponding patterns overlap at the measurement point and can be easily confused with one another, without it being easy to identify each and every one of the defects, the operator's experience being crucial for a correct diagnosis. Furthermore, the noise not removed in commercial techniques makes the identification of different sources of PDs through the simple observation of their patterns of PDs even more difficult.

According to the new invention, this problem is solved by automatically generating a pattern of PD pulses associated with the partial discharges located in each position along the length of the cable for the purpose of preventing the overlap of patterns associated with defects that were in different locations (different cable junctions, terminations) after the prior removal of the background noise. Once the patterns are separated by position, the invention includes an automatic defect pattern recognition tool, trained through a neural network so that the operator can emit an efficient evaluation of the insulation condition.

BRIEF DESCRIPTION OF THE DRAWINGS

For the purpose of complementing the description and making the explanation thereof easier, a set of drawings is attached solely for a non-limiting illustrative purpose in which:

FIG. 1 is a graphical representation illustrating partial discharge signals (1.1) discriminated by the filter that uses wavelet transform with complementary statistical processing, which were initially immersed with a sinusoidal modulated noise (1.2). The recorded time interval of FIG. 1 corresponds to a time segment where the voltage of the power grid (1.3) was growing to the negative peak.

FIG. 2a corresponds to the acquired signal (noise+PD pulses) (2a.2) and the resulting signal (2a.1) after applying the filter that uses wavelet transform with complementary statistical processing, in which a clear partial discharge pulse is superimposed immediately after the second crest of a sinusoidal noise.

DESCRIPTION OF AN EMBODIMENT OF THE INVENTION

Figure 3A:
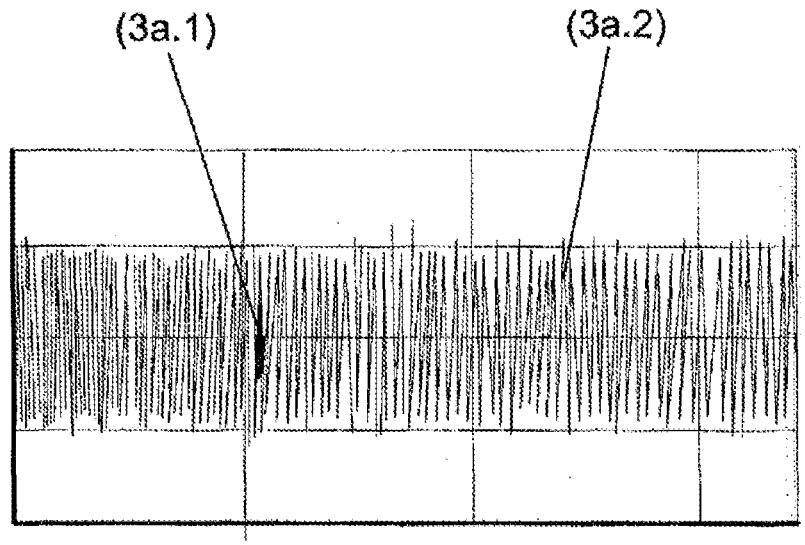
FIG. 3a corresponds to the acquired signal (noise+PD pulses) (3a.2) and the resulting signal (3a.1) after applying the filter that uses wavelet transform with complementary statistical processing. The PD pulse was initially immersed with a white noise.

As mentioned above, the present invention consists of a method for measuring and analysing the measurement, for an efficient evaluation of the insulation condition of the high voltage cables during their operation in the grid which improves the techniques currently used and overcomes, as stated, the drawbacks associated with these techniques.

To enable applying the method for evaluating the insulation condition of the high voltage cables proposed by the invention, there have to be at least two sensors working in a frequency range comprised between 1 MHz and 20 MHz, located along the section of the cable that is going to be analysed. PD sensors integrated in each accessory or external sensors are used for that purpose. Electromagnetic capacitive sensors are arranged integrated in the cable, whereas the high frequency current transformer type sensors are placed encircling the shields of the cable (non-invasive sensors).

Therefore, the objective of the new invention is to improve the results of the evaluation of the insulation condition of the high voltage cables installed and in service which are obtained using current technologies to enable providing a new method capable of detecting, discriminating between electric noise signals and "partial discharge" type signals, locating their position along the length of the cable, knowing their magnitude, identifying the sources of PDs produced in different positions along the length of the cable and, finally, diagnosing the severity of each of the defects found.

This objective has been fully achieved with the present invention and is characterised by the attached claims in which the claimed method contemplates the stages that are described below and schematically shown in relation to the flow chart of FIG. 4 of the drawings. Therefore:

A first stage of the method (block 4.1) consists of acquiring synchronised captures of the signal collected by each sensor during time intervals equal to a period of the grid voltage. The synchronisation of the capture is performed by means of a simultaneous trigger signal for triggering the different signal acquisition units, for example through a trigger signal transmitted via fibre optic with low latency repeaters (negligible delay) distributed along the length of the cable. Synchronised triggering is very important to enable subsequently locating the position of the sources of PDs.

In a second stage (block 4.2), the discrimination of the electric noise in relation to the acquired signal is carried out. The noise is caused by a mixture of signals coupled to the PD signals, either in a conducted manner through the power supply system or the grounding system, or transmitted in a broadcast manner, for example by radio stations, mobile telephones, etc. The removal of the noise is performed by means of filtering the signals conducted by the power supply and the grounding and by means of a numerical treatment of the signals captured through the sensors. The numerical processing of the present invention consists of performing the Wavelet transform of the acquired signal and statistically analysing its components in order to find transient events characteristic of PD signals (damped oscillation pulse) which are distinguished from the statistical evolution of the electric noise. A parameter associated with the standard deviation of the signal in the capture period is used for the statistical analysis of the signals. By applying this method to the original recorded signal, it is possible to discriminate electric noise from transient sub-damped pulses characteristic of PDs. However, it must be indicated that the signals recognised as transient PDs different from the noise can come from insulation defects in the cable object of evaluation or in other high voltage equipment, or it can come from the power electronics connected to the grid which produce similar transient events in the PD pulses of insulation failures. In stages nine and ten below, analysis tools are arranged so that the operator can distinguish clusters of PD signals due to insulation failures from PD clusters caused by power electronics.

By analysing FIGS. 1 and 2, some filtering details can be seen. In this sense, FIG. 1 shows a ratio of the order of ⅛ between the amplitude level of the PD signal (1.1) in relation to the amplitude of the noise signal (1.2); the voltage waveform is represented in the graph under the preceding signals and identified with reference (1.3). In turn, FIG. 2 illustrates two details (a-b) which graphically represent a PD signal (2a.1) when it is superimposed on the crest of the noise signal (FIG. 2a), the resulting signal of which is shown in (2a.2), and when a PD signal (2b.1) is superimposed close to the zero level of the slope of the noise signal (FIG. 2b), the signal shown with reference (2b.2) being obtained as the resulting signal.

Figure 3B:
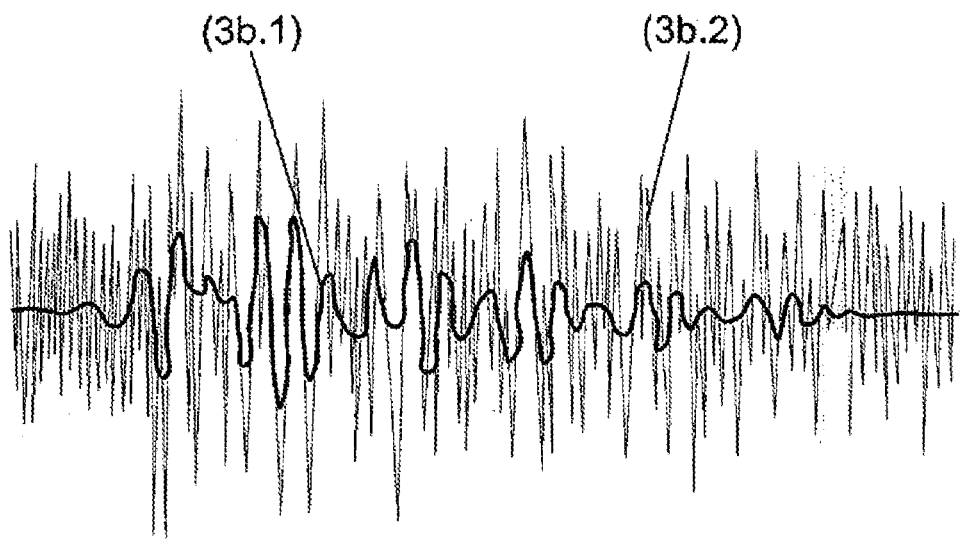
FIG. 3b illustrates an enlarged view showing the acquired signal (noise+PD pulses) (3b.2) and the resulting signal (3b.1) after applying the filter that uses wavelet transform with complementary statistical processing. The PD pulse was initially immersed with a white noise.

If FIG. 3 is observed, representations related to the identification of a partial discharge (PD) signal (3a.1) immersed in white noise (3a.2) having an amplitude that is about twice the amplitude of the PD (FIG. 3a), and a detailed enlargement of the area in which the applied method of the present invention (FIG. 3b) shows that, when immersed in white noise (3b.2), there is a superimposed transient event formed by a damped oscillation pulse (3b.1) characteristic of a PD signal, which ratifies the correct working of the method used for discriminating between white noise and the PD-type signal.

Going back to the stages of the process, the third and fourth stages (blocks 4.3 and 4.4 of the flow chart of FIG. 4) consist of associating to each characteristic PD signal of a set of representative parameters which will subsequently allow forming PD clusters. Two different types of processing are performed for that purpose, and the parameters thus calculated are saved in a database (block 4.11).

The individual PD signals are processed in the third stage (block 4.3) for determining the following parameters for each PD-type signal: the pulse arrival time $t_i$ and the phase angle over time $\phi_i$ in relation to the zero-crossing of the grid voltage signal. Two additional parameters related to the magnitude of the PD signal are also determined: the amplitude of a pulse envelope A and a parameter correlated to the integral of the PD envelope.

PD signals collected by the different sensors and data acquisition systems are processed in the fourth stage (block 4.4) in order to determine the following additional parameters: parameter of the phase $\phi$ (L1, L2, L3) where the PD signal is originated, taking into account the highest amplitude of the detected signals from the sensors located in the accessories (junction or termination) of the three phases and the parameter associated with the location along the length of the cable of the PD-type signal $x_i$ where it is estimated that the PD has been generated, which is calculated by means of the delay time, $x_i$ ($\Delta t_i$), between the arrival of each PD signal to the two sensors installed consecutively along the very shield of the cable.

The process of the preceding stages (from the first to the fourth) is repeated in the fifth stage of the method (block 4.5) until completing 50 acquisitions of PD signals for 50 Hz grids, and 60 acquisitions for 60 Hz grids, equivalent to a total acquisition time interval of 1 second. The objective of this step is to provide sufficient data for determining the magnitude of the amplitudes of the PD-type signals and their rate of repetition per period of the grid voltage, as well as increasing the data associated with the location of the PDs along the length of the cable. Once the stage is completed, the next block, the sixth stage, is accessed, where the magnitude of the amplitudes of the PD pulses and the rate of repetition of PD signals per period of the voltage are determined for the PDs detected by each sensor. The magnitude of the amplitude is determined as the largest magnitude occurring repeatedly in each of the sensors, which is calculated through the quasi-peak value of the amplitudes of the PD signals recorded in the 50 acquisitions and the rate of repetition is determined as the mean value of the PD-type signals detected per period through a sensor in the 50 or 60, as the case may be, acquisitions performed. The calculated data is stored in a database (block 4.11) to learn the historical evolution of the PD-type signals detected through the sensor in consideration.

The process of the preceding steps is repeated in the seventh stage (block 4.7) until completing a statistically representative number of acquisitions to reliably perform the process of locating PD-type signals, representing their pattern in phase with the voltage and recognising defects associated with each pattern, corresponding to the next eighth, ninth and tenth stages, respectively. The number of acquisitions considered the statistical minimum for reliably performing the mentioned analysis is 200, but the larger this number is, the more reliable the diagnosis will be.

Once the preceding stage is successfully completed, the next eighth stage (block 4.8) is accessed, where the location maps of the sources of PDs are determined as a function of the position the PD-type signals occupy along the length of the cable taking into account the data stored in the database (block 4.11) for each PD signal. The mentioned map is constructed taking into account the parameter of the location of each PD type signal $x_i$, together with a coherence analysis. The mentioned coherence analysis consists of rejecting the PD pulses coming from reflections in accessories, and rejecting the locations $x_i$ determined from two PD signals with inconsistent damping with the distance separating the source of the PD and the sensor. The amplitude of each PD pulse sensed by a sensor is corrected for taking into account the damping of the signal. The map of PDs includes two different types of data for each location of the PD pulses: the mean rate of the number of PD pulses per period of the applied voltage wave and the amplitudes of the original PD signals in the locations where they are generated. These two pieces of data are determined by statistical analysis of the set of PDs located in each location where PDs occur.

"Location of PD pulses" must be understood as a section of the cable of approximately 3 to 5 m where the PDs originate. The location is identified in relation to the distance relative to a specific sensor taken as a reference which is arranged in a cable junction or termination.

The pulses of the PDs are graphically represented in the ninth stage (block 4.9) with their phase angle position over time $\phi_i$ in relation to the zero-crossing of the grid voltage signal, associated with the PDs in each location of the cable where PDs occur to enable having a pattern of PDs representative of each location of PDs to enable applying the following stage.

A comparison of the pattern of the PD pulses in phase with the applied voltage wave and reference patterns is performed in the tenth stage (block 4.10). The risk of insulation failure is known to depend on the physical process causing PD pulses, for example corona in air pulses are not crucial for causing the dielectric breakdown of the insulation, but partial discharges due to an internal cavity-type defect are critical for the insulation service life. It is therefore very important to know the type of defect associated with each source of PD to enable evaluating the insulation condition of a cable and of its accessories (terminals and junctions). The pattern formed by the PD pulses in phase with the applied voltage wave associated with each location of PDs is compared with the reference patterns associated with typical defects for the purpose of evaluating the defect risk of each of the sources of PDs detected in each location. This comparison allows recognising typical defects. A neural network for pattern recognition is applied to each of the sources of PDs detected for automatic recognition.

Figure 4:
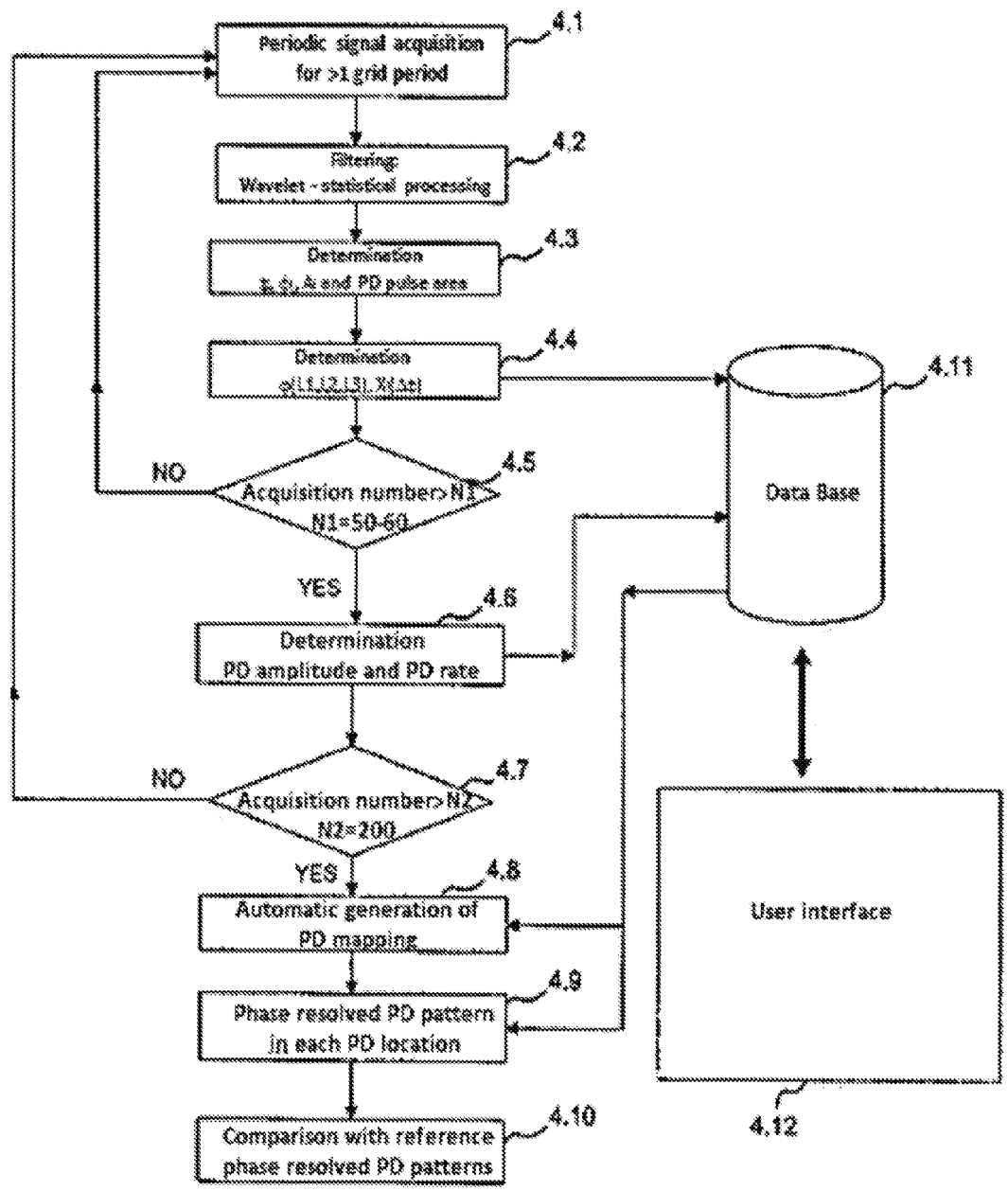
FIG. 4 is a flow chart of the method for continuous monitoring and diagnosis of sources of partial discharges in high voltage cables during connection to, and operation in the power grid.

A user interface (block 4.12), schematically shown in FIG. 4, allows showing the processed data for performing the final evaluation of the insulation condition of the cable from the following information:

Historical evolution of the PDs measured by each sensor in an accessory (sixth stage, block 4.6);

Map of PDs where the sources of PDs are located (eighth stage, block 4.8);

Phase-resolved pattern of the PDs in each location (ninth stage, block 4.9);

Phase-resolved pattern recognition for each source of PD (tenth stage, block 4.10).

The new method for monitoring partial discharges in cables installed and in service for discriminating, locating, measuring, identifying and diagnosing sources of partial discharges has been sufficiently described above. Additionally, another object of the invention is the implementation of a system for carrying out said method, which will be described below.

Figure 5:
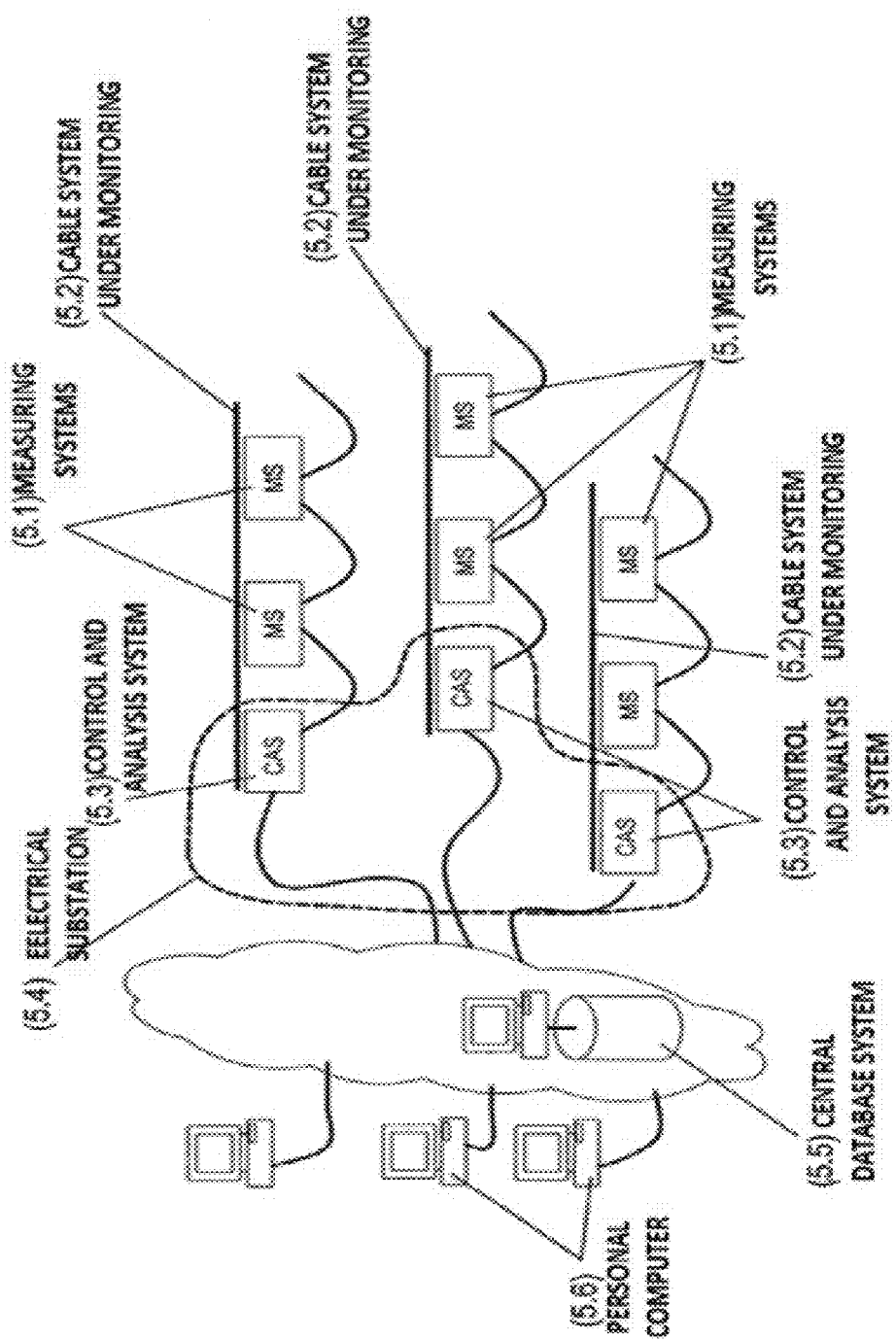
FIG. 5 is a diagram of the general structure of the hardware system for applying the method for continuous monitoring and diagnosis of sources of partial discharges in high voltage cables during connection to, and operation in the power grid.

According to the invention, the purpose of the physical system for applying the proposed method is to continuously monitor PDs that are produced in different cables connected to a transformer sub-station. The structure of this system corresponds to the general diagram depicted in FIG. 5 of the drawings, and shows a number of measurement systems (MS) (5.1) for measuring partial discharges distributed along respective cables (5.2) for collecting PD signals. There must be at least two measurement systems, one at each end of a cable (5.2) to be monitored. The MSs (5.1) do not have any individual processing capacity, but are controlled by the computer of a Control and Analysis System CAS (5.3) which is arranged in one of the two transformer sub-stations (5.4) where the cable is connected. The information of each CAS (5.3) is sent to a Central Database System (CDBS) (5.5) so that it can be consulted from any computer (5.6) connected to the data network. The PD-type signals together with the electric background noise present are captured here and recorded by the measurement system (5.1) (first stage (block 4.1) of the flow chart of FIG. 4), and sent through a Data Transmission Network DTN (6.3), FIG. 6, to a computer acting as the Control and Analysis System CAS (6.1) for processing and analysing the measured signals (second to tenth stages (blocks 4.2 a 4.10) of the flow chart of FIG. 4), as follows:

a) discriminating the electric background noise of the PD-type signals (second stage (block 4.2) of the flow chart of FIG. 4), b) locating the position of the sources of PDs in the locations of the cable where they originate (stages associated with blocks 4.3, 4.4, 4.5, 4.7 and 4.8) of the flow chart), c) learning their amplitude and rate of repetition (stages associated with blocks 4.3, 4.5 and 4.6) of the flow chart), d) identifying the pattern of PDs as a function of the phase difference of the PD pulses with the grid voltage wave (ninth stage (block 4.9) of the flow chart), and e) diagnosing each pattern associated with a location producing PDs with a cavity-type defect, external surface discharge or corona (tenth stage (block 4.10) of the flow chart).

Figure 6:
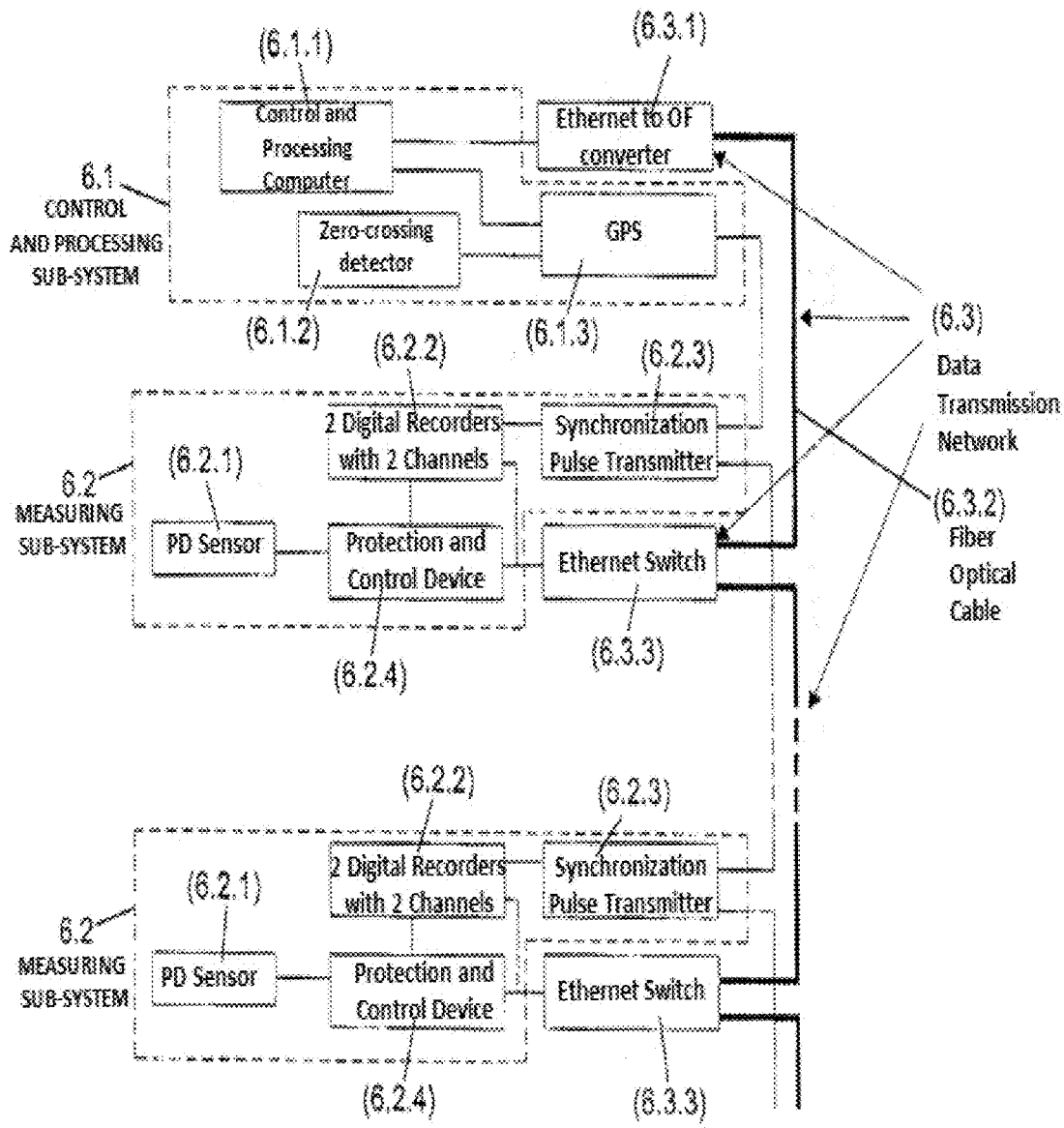
FIG. 6 is a diagram of the sub-systems integrating the system of FIG. 5.

The sub-systems making up the system for monitoring shown in FIG. 6 of the drawings are as follows:

Control and Analysis Sub-System (6.1), Made Up of the Following Elements:

Control and Processing Computer CPC (6.1.1), which compiles and processes the signals measured by the MSs (6.2) according to the method of analysis described in the flow chart of FIG. 4, and decides the generation rate of synchronisation pulses;

GPS Synchronisation Pulse Generator (6.1.3), provided for generating a synchronisation pulse based on the rate previously established by the CPC (6.1.1) and coinciding with a zero-crossing of the voltage, and sending it through a fibre optic cable FOC (6.3.2);

Zero-crossing Detector (ZCD) (6.1.2), informing the GPS (6.1.3) when the grid voltage wave of the monitored line crosses zero.

Sub-Measurement Systems (6.2), Distributed Along the Length of the Cable, each Made Up of:

three Partial Discharge Sensors PDS (6.2.1), located in the shields of the accessories (terminations and/or junctions) of each phase. The non-invasive sensors used are high frequency current transformers (HFCT) having a bandwidth comprised between 1 MHz and 20 MHz which are arranged coupled to the shields of the cables in the accessories; sensors integrated in the very accessory of the cable can also be used;

two Digital Recorder DR cards (6.2.2) having two channels each, triggered by the synchronisation pulse coming from the GPS (6.1.3). The output of each sensor (6.2.1) is connected to a DR channel (6.2.2), so three recording channels are used for three-phase electric line, one being a reserve channel. The sampling speed and minimum vertical resolution of each recording card is at least 100 Mega-samples per second and 10 bits;

one Synchronisation Pulse Transmitter SPT (6.2.3), converting the synchronisation pulse coming from the FOC (6.3.2) into an electric trigger pulse of the DR (6.2.2), to then again convert it into an optical pulse to be sent to the next following MS (6.2) via the FOC (6.3.2), and Protection and Control Equipment PCE (6.2.4), protecting the two DR (6.2.2) and the SPT (6.2.3) of the MS (6.2) against surges and excessive temperatures, while at the same time it allows controlling the two DR (6.2.2) through CAS commands (6.1).

Data Transmission Network, DTN (6.3), Made Up of the Following Elements:

Ethernet to Fibre Optic Converter E-FOC (6.3.1), allowing data transfer from the CAS (6.1) to the FOC (6.3.2) and vice versa;

a Fibre Optic Cable (FOC) (6.3.2), with two fibres for transferring data and another fibre for the synchronisation pulse, and a Switch Ethernet SE (6.3.3) with two optical inputs for converting data from the MS (6.2) into optical signals, to be transmitted via the FOC (6.3.2), as well as receiving CAS commands and control (6.1).

It is not considered necessary to further develop the content of the present description so that a person skilled in the art can understand its scope and the advantages derived from it.

Notwithstanding the foregoing, it must be understood that the description made corresponds solely to a preferred embodiment of the invention, and that it can therefore be subjected to likewise protected changes, modifications and/or alterations, provided that they fall within the scope of the attached claims.

The invention claimed is:

1. A method for monitoring partial discharges in a high voltage cable, the method comprising:

measuring electric signals of the cable for a time interval of at least one grid voltage period with a plurality of partial discharge sensors;

filtering noise of the measured signal by calculating a Wavelet transform and identifying a partial discharge as a function of a statistical dispersion of components of said transform;

determining in the filtered signal a start time of a pulse and at least one of the following parameters: phase angle over time in relation to the zero-crossing of a grid voltage, amplitude and an integral of the pulse of the partial discharge at the sensing point, identifying the cable where the partial discharge originates as a function of a highest amplitude of the signals detected by each trio of sensors positioned in accessories, and determining the parameter associated with a location of the partial discharge, taking into account differences of arrival times to the different sensors that have detected the partial discharge.

2. The method according to claim 1, comprising determining a location map of partial discharges as a function of the parameter of the location of each partial discharge.

3. The method according to claim 2, comprising generating a pattern of partial discharges as a function of the phase angle with a voltage wave applied in each group of partial discharges positioned in the same location of the cable.

4. The method according to claim 3, comprising establishing a correlation of each group of partial discharges generated by recognising the patterns of partial discharges as a function of the phase angle with the voltage wave applied to the cable.

5. The method according to claim 4, comprising evaluating insulation status of the cable from a historical evolution of the partial discharges, the location map of partial discharges, the phase-resolved pattern of the partial discharges in each location and the recognition of the pattern of partial discharges.

6. The method according to claim 1, wherein the electric signals of the cable are measured by at least two partial synchronised discharge sensors placed at different locations of the high voltage cable.

7. The method according to claim 6, wherein synchronisation is performed by means of a pulse transmitted via fibre optic.

8. A system for monitoring partial discharges in a high voltage cable, comprising:
- at least two sensors configured to measure electric signals of the cable for a time interval of at least one grid voltage period with a plurality of partial discharge sensors;
- a computer configured for filtering noise of a measured signal by calculating a Wavelet transform and identifying a partial discharge as a function of statistical dispersion of components of said transform;
- the computer being configured to determine in the filtered signal a start time of a pulse and at least one of the following parameters: phase angle over time in relation to zero-crossing of a grid voltage, amplitude and the integral of the pulse of the partial discharge at a sensing point
- the computer being configured to identify the cable where the partial discharge originates as a function of a highest amplitude of the signals detected by each trio of sensors positioned in each accessory, and determining the parameter associated with a location of the partial discharge, taking into account differences of arrival times to the different sensors that have detected the partial discharge.

9. The system according to claim 8, wherein the computer is configured for determining a location map of partial discharges, as a function of the parameter of location of each partial discharge.

10. The system according to claim 9, wherein the computer is configured for generating a pattern of partial discharges as a function of the phase angle with a voltage wave applied in each of the groups of partial discharges positioned in a same location of the cable.

11. The system according to claim 10, wherein the computer is configured for establishing a correlation of each group of partial discharges generated by recognising a patterns of partial discharges as a function of the phase angle with the voltage wave applied to the cable.

12. The system according to claim 11, wherein the computer is configured for evaluating insulation status of the cable from historical evolution of the partial discharges, the location map of partial discharges, the phase-resolved pattern of the partial discharges in each location and recognising the pattern of partial discharges.

\* \* \* \* \*